(12) United States Patent
Sohn et al.

(10) Patent No.: US 12,342,637 B2
(45) Date of Patent: Jun. 24, 2025

(54) CMOS RGB-IR SENSOR WITH QUADRUPLE-WELL STACK STRUCTURE

(71) Applicant: Himax Imaging Limited, Tainan (TW)

(72) Inventors: Youngchul Sohn, Tainan (TW); Kihong Kim, Tainan (TW)

(73) Assignee: Himax Imaging Limited, Tainan (TW)

( * ) Notice: Subject to any disclaimer, the term of this patent is extended or adjusted under 35 U.S.C. 154(b) by 817 days.

(21) Appl. No.: 17/099,736

(22) Filed: Nov. 16, 2020

(65) Prior Publication Data
US 2022/0157879 A1  May 19, 2022

(51) Int. Cl.
*H10F 39/18* (2025.01)
*H10F 30/21* (2025.01)
*H10F 30/26* (2025.01)
*H10F 39/00* (2025.01)
*H10F 39/12* (2025.01)
*H10F 77/14* (2025.01)

(52) U.S. Cl.
CPC ............ *H10F 39/18* (2025.01); *H10F 30/26* (2025.01); *H10F 30/288* (2025.01); *H10F 39/1847* (2025.01); *H10F 39/199* (2025.01); *H10F 77/148* (2025.01); *H10F 39/8063* (2025.01); *H10F 39/8067* (2025.01)

(58) Field of Classification Search
CPC .......... H01L 27/14643; H01L 27/1464; H01L 21/14652; H01L 27/14627; H01L 27/14629; H01L 31/03529; H01L 31/1013; H01L 31/111
See application file for complete search history.

(56) References Cited

U.S. PATENT DOCUMENTS

| | | | | |
|---|---|---|---|---|
| 4,450,466 A | * | 5/1984 | Nishizawa | H01L 21/76216 257/292 |
| 7,233,036 B1 | * | 6/2007 | Hsu | H01L 27/14645 257/E27.131 |
| 2004/0125222 A1 | * | 7/2004 | Bradski | H04N 23/20 257/E27.138 |
| 2007/0158771 A1 | * | 7/2007 | Hynecek | H01L 27/14643 257/431 |
| 2008/0277701 A1 | * | 11/2008 | Lee | H01L 27/14689 257/292 |
| 2010/0102206 A1 | * | 4/2010 | Cazaux | H01L 27/14603 257/432 |
| 2012/0175691 A1 | * | 7/2012 | Wu | H01L 27/14607 257/292 |

(Continued)

*Primary Examiner* — Brigitte A Paterson
(74) *Attorney, Agent, or Firm* — Winston Hsu

(57) ABSTRACT

A CMOS image sensor includes: a substrate containing a potential well stack including: a first p-well, a first n-well disposed below the first p-well, a second p-well disposed below the first n-well, a second n-well disposed below the second p-well, and a third p-well disposed below the second n-well, wherein a first photodiode is formed at the junction between the first p-well and first n-well, a second photodiode is formed at the junction between the first n-well and second p-well, a third photodiode is formed at the junction between the second p-well and the second n-well, and a fourth photodiode is formed at the junction between the second n-well and the third p-well, and each photodiode is disposed at a different respective depth within the substrate; and a plurality of active pixel sensors for converting light received by the photodiodes into electrical charge.

5 Claims, 5 Drawing Sheets

(56) References Cited

U.S. PATENT DOCUMENTS

| | | | |
|---|---|---|---|
| 2013/0105945 A1* | 5/2013 | Tsai | H01L 31/111 |
| | | | 257/610 |
| 2016/0169734 A1* | 6/2016 | Uedaira | G01J 1/0492 |
| | | | 250/208.2 |
| 2017/0154906 A1* | 6/2017 | Gaebler | H01L 31/103 |
| 2018/0003556 A1* | 1/2018 | Uedaira | H01L 27/14647 |
| 2020/0328243 A1* | 10/2020 | Micinski | H01L 27/14607 |
| 2021/0167234 A1* | 6/2021 | Nakano | H01L 31/102 |

* cited by examiner

CMOS RGB-IR SENSOR WITH QUADRUPLE-WELL STACK STRUCTURE

BACKGROUND OF THE INVENTION

1. Field of the Invention

The invention relates to CMOS image sensors, and more particularly, to a CMOS image sensor including RGB and IR pixels, wherein the CMOS sensor has a quadruple-well stack structure.

2. Description of the Prior Art

CMOS image sensors use a photosensitive silicon substrate having photodiodes formed of junctions between potential wells. In order to collect charge, the photo-diode is reverse biased to form a depletion region. Incident light is absorbed by the substrate and generates electron-hole pairs which move through a diffusion layer in the substrate and are collected in the potential wells during an integration period. The resulting electrical charge can then be converted to a photocurrent and used to generate digital images.

Refer to FIG. 1, which is a diagram of a conventional back side illuminated (BSI) CMOS sensor 10. As shown in the diagram, the CMOS sensor 10 consists of a silicon substrate 45, having a plurality of micro-lenses 20 on the surface. Below each micro-lens is a filter allowing light of a particular wavelength to pass through. In the CMOS sensor 10 shown in FIG. 1, the filters are B (blue light), R (red light), G (green light) and IR pass filter (infrared light). Photodiodes (PD) 50 are formed below the filters for receiving the filtered light and converting this light into electrical charge. An antireflective film 40 is formed above the photodiodes 50 for improving photon absorption. Metal wiring 60 is placed below the photodiodes for converting the collected electrical charge to voltage and supplying the photocurrent to a processor (not shown). A conventional front side illuminated (FSI) CMOS sensor will have a similar structure except that the metal wiring is disposed above the photodiodes.

Because visible (RGB) light may also have some light in the infrared or near infrared (NIR) range, the CMOS sensor 10 shown in FIG. 1 employs a selective near infrared (SNIR) cut filter 35, which ensures that only light in the visible range will be transmitted to the photodiodes for sensing RGB light. Similarly, the IR pass filter 25 works to prevent any light in the visible range from passing to the photodiodes 50 for sensing IR light.

This implementation is illustrated in FIG. 2, which is a graph of quantum efficiency against wavelength, illustrating how the IR pass filter 25 and SNIR filter 35 only allow light of a certain wavelength to be transmitted. As shown in the graph, the SNIR filter blocks light in the NIR range such that only light having a wavelength in the visible range will be passed by the RGB pixels, and the IR pass filter blocks light in the visible range such that only light having a wavelength in the NIR range will be passed by the IR pixel.

Although such a structure can effectively prevent interference between the two types of sensing pixels, this implementation is both costly and complex. Therefore, there is a need for a novel CMOS sensor which can prevent interference between visible and invisible light which can be implemented at low cost.

SUMMARY OF THE INVENTION

This in mind, the present invention aims to provide a CMOS image sensor which can prevent interference between visible and invisible signals without requiring complex and expensive components.

This is achieved by a CMOS image sensor having a quadruple-well stack structure.

The CMOS image sensor having a quadruple well stack structure comprises: a plurality of micro lenses, for receiving incident light; a substrate, disposed below the plurality of micro lenses, the substrate containing a potential well stack comprising: a first p-well disposed below the micro lenses, a first n-well disposed below the first p-well, a second p-well disposed below the first n-well, a second n-well disposed below the second p-well, and a third p-well disposed below the second n-well, wherein a first photodiode is formed at the junction between the first p-well and first n-well, a second photodiode is formed at the junction between the first n-well and second p-well, a third photodiode is formed at the junction between the second p-well and the second n-well, and a fourth photodiode is formed at the junction between the second n-well and the third p-well, and each photodiode is disposed at a different respective depth within the substrate; and a plurality of active pixel sensors for converting light received by the photodiodes into electrical charge. The first photodiode is for receiving blue light and is disposed in the substrate at a depth of 0.2~0.5 micrometers, the second photodiode is for receiving green light and is disposed in the substrate at a depth of 0.5~1.5 micrometers, the third photodiode is for receiving red light and is disposed in the substrate at a depth of 1.5~3 micrometers the fourth photodiode is for receiving infrared light and is disposed in the substrate at a depth of 3 micrometers and below.

In an embodiment, the CMOS image sensor of claim 1 may be a front light illuminated (FSI) sensor. In another embodiment, the CMOS image sensor may be a back light illuminated (BSI) sensor.

In an embodiment, the CMOS image sensor may be a BSI sensor further comprising a reflector for enhancing the received infrared light.

An active pixel sensor control circuit for converting incident light received by the CMOS image sensor into electrical charge is also disclosed. The active pixel sensor control circuit comprises: a first control circuit for controlling the first photodiode, a second control circuit for controlling the second photodiode, a third control circuit for controlling the third photodiode and a fourth control circuit for controlling the fourth photodiode. The first control circuit and the third control circuit are a second type control circuit, and the second control circuit and the fourth control circuit are a first type control circuit. The first type control circuit comprises: a four transistor (4T) active pixel sensor comprising a transfer transistor, a reset transistor, a source follower and a select transistor, wherein the reset transistor and the source follower are coupled to a first power supply signal. The second type control circuit comprises: a 4T active pixel sensor comprising a transfer transistor, a reset transistor, a source follower and a select transistor, wherein the source follower is coupled to the first power supply signal, the reset transistor is coupled to a second power supply signal, and the second power supply signal is less than the first power supply signal. When a transfer signal is applied to the gates of the transfer transistors and a reset signal is applied to the gates of the reset transistors, the second photodiode and the fourth photodiode are charged to the first power supply level, and the first photodiode and the third photodiode are discharged to the second power supply level.

In an embodiment, each of the select transistors is coupled to a same column bus, so that signals from the first photodiode, the second photodiode, the third photodiode and the fourth photodiode are readout sequentially when a select signal is applied to the gates of the select transistors.

In another embodiment, each of the select transistors is coupled to a different respective column bus, and the four column buses are coupled to the first power supply, so that the signals from the first photodiode, the second photodiode, the third photodiode and the fourth photodiode are read out at a same time when a select signal is applied to the gates of the select transistors.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a CMOS image sensor which does not require an SNIR filter or an IR pass filter. As light has a different absorption ratio depending on its wavelength, the CMOS image sensor of the present invention uses a quadruple-well stack structure to form the photodiodes for each colour pixel (RGB-IR). The individual photodiodes are formed at the junction between each potential well. By distributing each photodiode at a different depth within the silicon substrate, wherein the depth is determined according to the individual absorption ratios of different wavelengths of light, only a specific wavelength of light will be absorbed by an individual photodiode while other wavelengths will be passed. Hence, the photodiodes act as their own filter.

Figure 1:
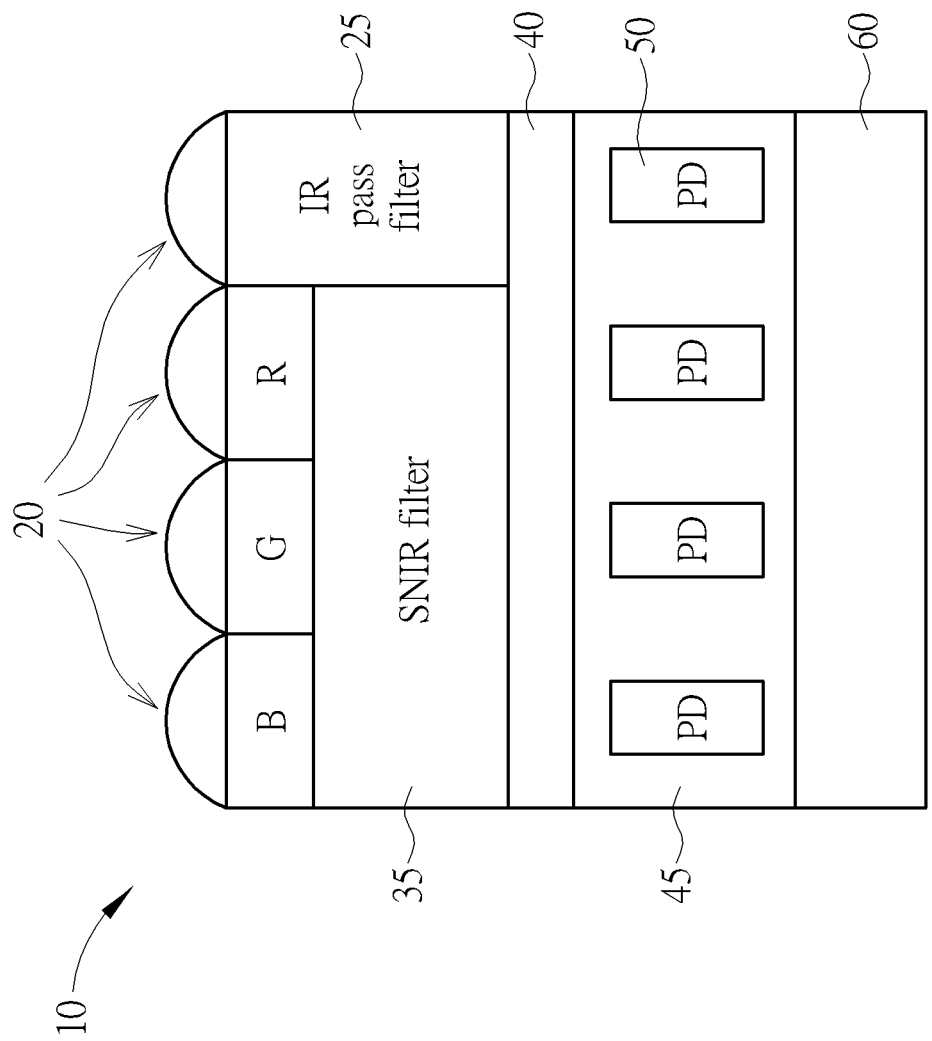
FIG. 1 is a diagram of a CMOS image sensor according to the conventional art.
Figure 2:
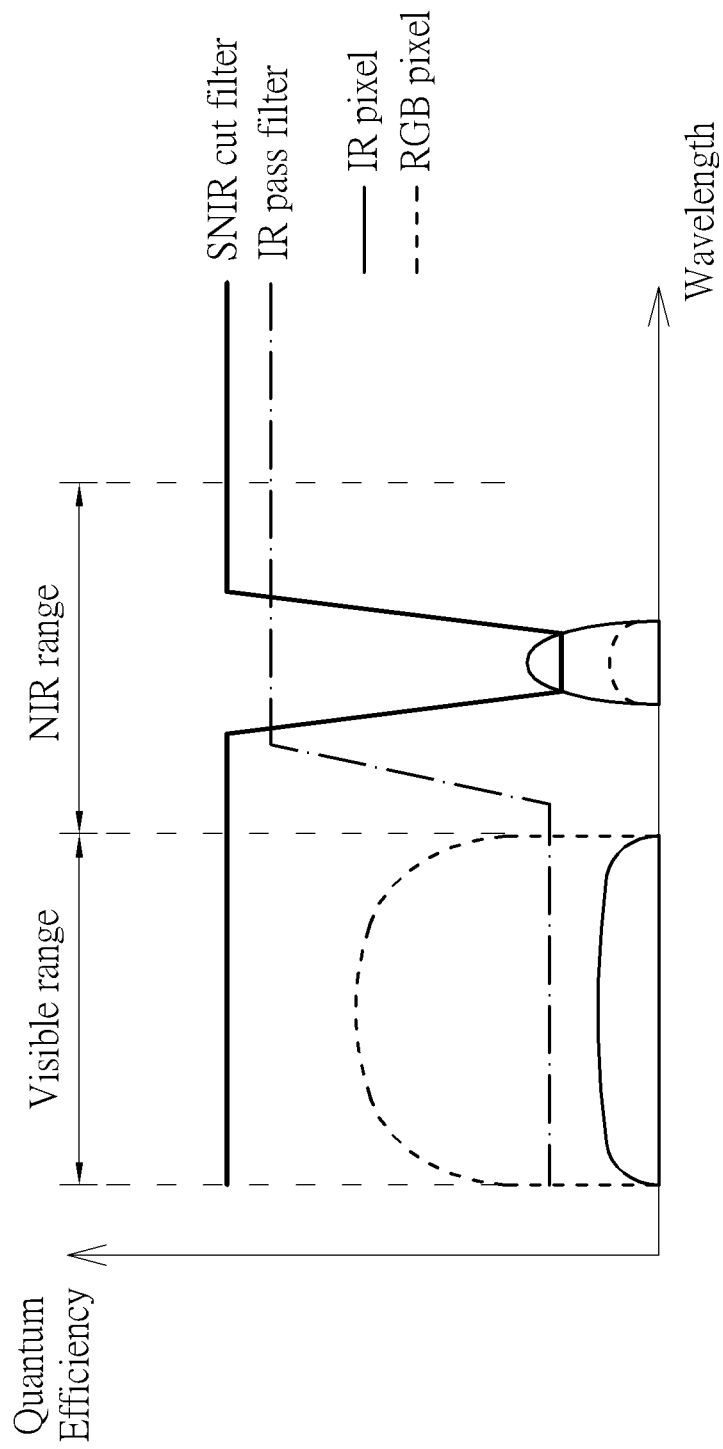
FIG. 2 is a diagram of the filter operation of the CMOS image sensor shown in FIG. 1.
Figure 3A:
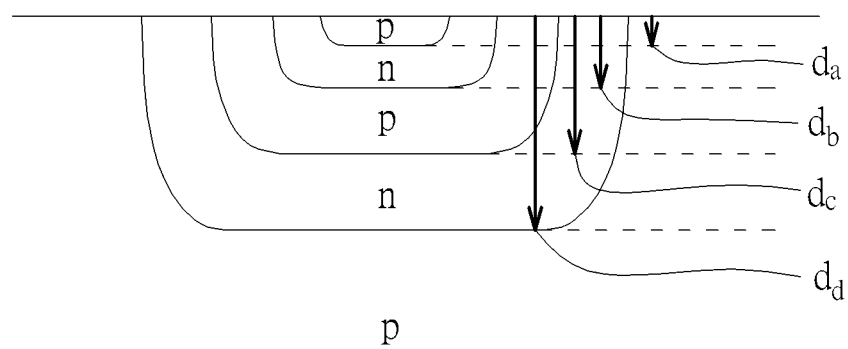
FIG. 3A is a cross-section diagram of a CMOS image sensor having a quadruple-well stack structure according to an exemplary embodiment of the present invention.
Figure 3B:
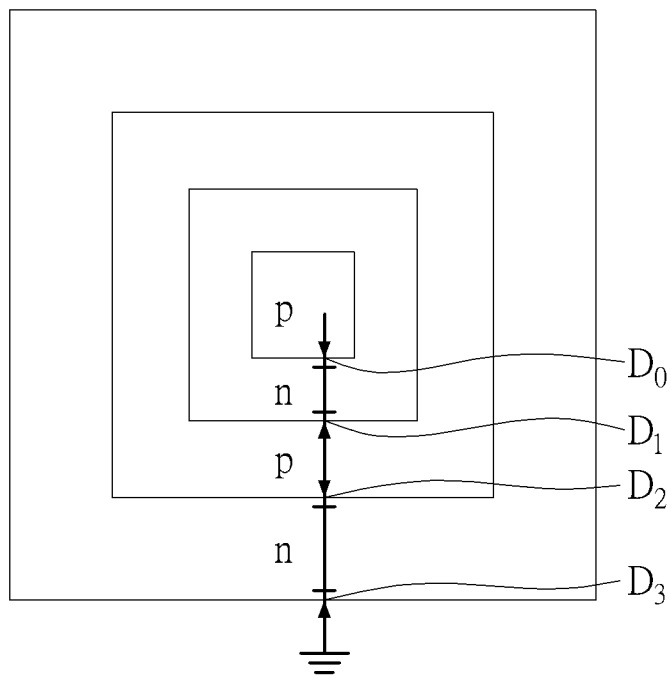
FIG. 3B is a top-view diagram of the CMOS image sensor shown in FIG. 3A.

Refer to FIG. 3A and FIG. 3B, which respectively illustrate a cross-section and a top view of the proposed quadruple well stack structure 300. As shown in FIG. 3A, a first p-well is distributed directly below the surface of the substrate, an n-well is distributed below the p-well, another p-well is distributed below the n-well etc. such that four photo-diodes at respective depths $d_a$, $d_b$, $d_c$ and $d_d$ are formed within the substrate 300, wherein $d_a$ is at a depth of 0.2~0.5 micrometers, $d_b$ is at a depth of 0.5~1.5 micrometers, $d_c$ is at a depth of 1.5~3 micrometers and $d_d$ is at a depth of 3 micrometers and below.

FIG. 3B illustrates the four photodiodes/PN junctions $D_0$, $D_1$, $D_2$ and $D_3$ which are formed by the quadruple wells. As light enters the substrate, it will be absorbed by each photodiode, with blue light being absorbed by the first photodiode $D_0$, then green light being absorbed by the second photodiode $D_1$, red light being absorbed by the third photodiode $D_2$ and finally IR light is absorbed by the deepest photodiode $D_3$.

The above design can be used in a standard BSI CMOS image sensor, a BSI CMOS image sensor with a reflective layer/IR enhancer layer, and also in a front side illuminated (FSI) CMOS sensor.

Figure 4:
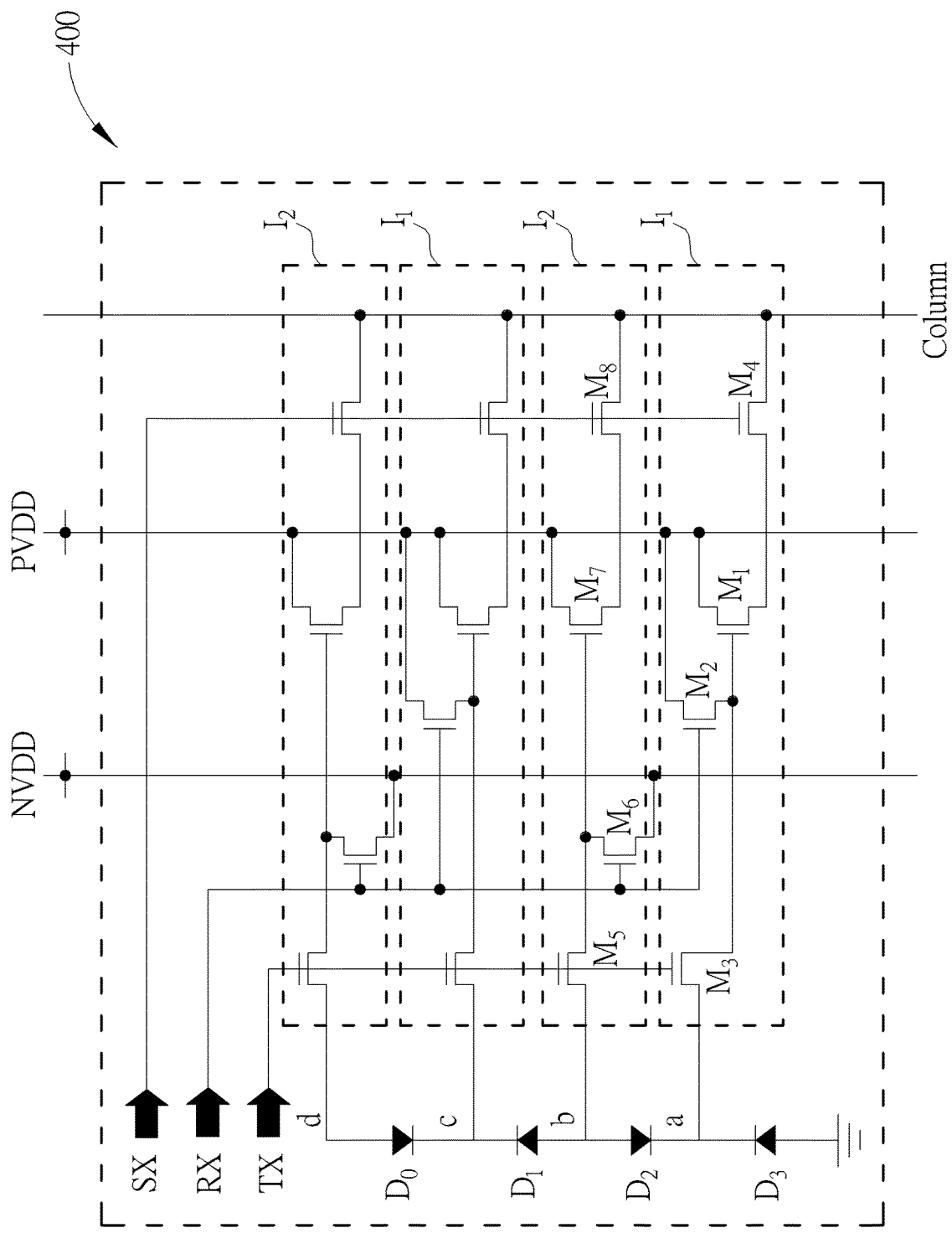
FIG. 4 is an active pixel sensor control circuit diagram of the CMOS image sensor shown in FIG. 3 according to a first embodiment of the present invention.

In order to effectively convert the charges collected by each photodiode into photocurrent, an active pixel sensor control circuit 400 for the quadruple well stack structure 300 is provided. This is illustrated in FIG. 4. In a conventional four transistor (4T) active pixel sensor, a transfer/sense transistor must be reverse biased in order to collect electrical charge during an integration period. This is achieved by inputting at least a reset signal to a coupled reset transistor. After the integration period is completed, a select signal will be activated to pass the collected electrical charge to a source follower and then a select transistor for outputting the photocurrent on a column bus.

Due to the quadruple-well stack structure 300 shown in FIG. 3A and FIG. 3B, the direction of the photodiodes $D_0$ and $D_2$ are different from the direction of the photodiodes $D_1$ and $D_3$. The circuit 400 therefore provides two different control mechanisms for reverse biasing the photodiodes. For simplicity of explanation, the following description will only refer to photodiodes $D_2$ and $D_3$. One skilled in the art will be able to apply the following description to photodiodes $D_0$ and $D_1$. As shown in FIG. 4, $D_2$ is coupled to a sense transistor $M_5$ which receives a transfer signal TX at its gate. $D_3$ is coupled to a sense transistor $M_3$ which also receives the transfer signal TX at its gate. $M_5$ is coupled to reset transistor $M_6$ which receives a reset signal RX at its gate and is coupled to power supply NVDD. $M_3$ is similarly coupled to reset transistor $M_2$ which receives the reset signal RX at its gate, but $M_2$ is coupled to power supply PVDD rather than NVDD. $M_6$ is coupled to source follower $M_7$, which is coupled to PVDD. $M_2$ is similarly coupled to source follower $M_1$ which is coupled to PVDD. $M_7$ is coupled to select transistor $M_8$, which receives a signal SX at its gate and outputs a signal on a column bus. $M_1$ is coupled to select transistor $M_4$, which receives the signal SX at its gate and outputs a signal on the column bus.

The dashed lines represent a pixel control circuit for each photodiode. The control circuit for photodiode $D_2$ is annotated $I_2$, and the control circuit for photodiode $D_3$ is annotated $I_1$. The photodiodes are reverse biased by applying signals TX and RX. For photodiode $D_3$, applying signals TX and RX to the gates of $M_3$ and $M_2$, respectively, charges node a to the PVDD level. As $D_3$ is also coupled to ground, this will increase the potential difference such that current cannot flow and charge can be collected when incident light is absorbed. For photodiode $D_2$, due to the different configuration of the control circuit $I_2$, applying the TX and RX signals to the gates of $M_5$ and $M_6$, respectively, node b will be discharged to the NVDD level. As node a is at PVDD, and NVDD is lower than PVDD, the potential difference therein is enough to reset photodiode $D_2$.

Note that the above circuit structure 400 is used for sequential readout of the pixel signals. The 4T active pixel sensor structure for each photodiode enables correlated double sampling (CDS) to be performed, wherein two samples of the pixel signal are taken, and one is subtracted from the other. The double sampling is usually first performed immediately after reset of the photodiode, and then after charge accumulation at the photodiode. This method will be well-known to those skilled in the art. Pixel readout can be performed in the conventional manner for a 4T active pixel sensor circuit.

Figure 5:
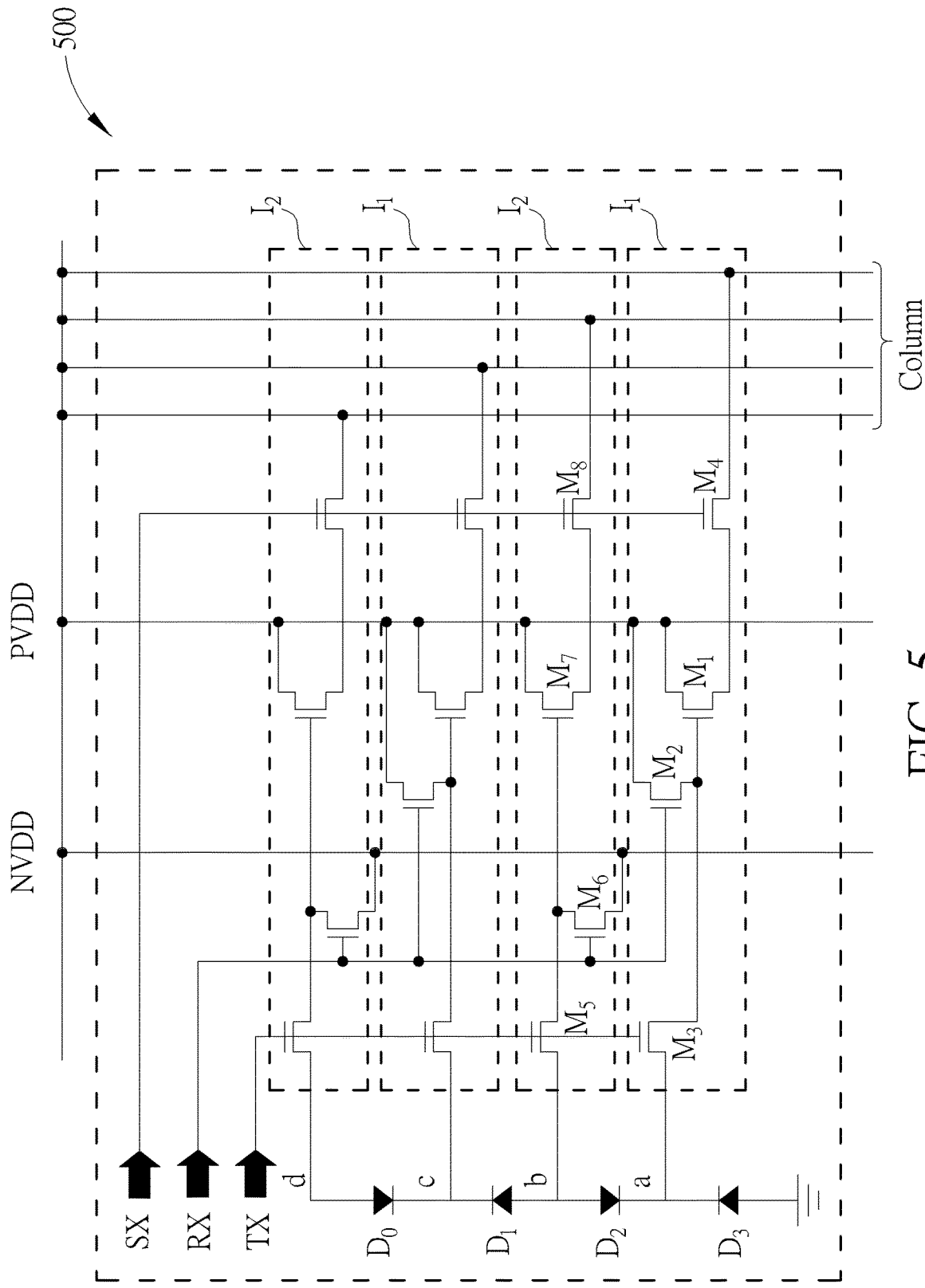
FIG. 5 is an active pixel sensor control circuit diagram of the CMOS image sensor shown in FIG. 3 according to a second embodiment of the present invention.

An additional circuit is provided which enables readout of all pixels at the same time. Refer to FIG. 5, which is a circuit diagram 500. Comparing the circuit 500 with the circuit 400 shown in FIG. 4, it can be seen that the difference therein is that there are four column buses respectively coupled to the select transistors, rather than all select transistors being coupled to a same column bus. Furthermore, the four column buses are also coupled to the power supply PVDD.

By using the fact that different wavelengths of light have absorption rates, the present invention has provided a CMOS image sensor which does not require extra filters. By placing each photodiode at a particular depth within a substrate corresponding to a specific absorption ratio of light, each photodiode can act as its own filter.

The present invention is therefore able to implement a CMOS image sensor which can effectively filter RGB-IR wavelengths of light without requiring additional filters or complicated circuitry.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A CMOS image sensor, comprising:
a plurality of micro lenses, for receiving incident light;
a substrate, disposed below the plurality of micro lenses, the substrate containing a potential well stack comprising:
a first p-well disposed below the micro lenses, a first n-well disposed below the first p-well, a second p-well disposed below the first n-well, a second n-well disposed below the second p-well, and a third p-well disposed below the second n-well, wherein a first photodiode for receiving blue light is formed at the junction between the first p-well and first n-well, a second photodiode for receiving green light is formed at the junction between the first n-well and second p-well, a third photodiode for receiving red light is formed at the junction between the second p-well and the second n-well, and a fourth photodiode for receiving infrared light is formed at the junction between the second n-well and the third p-well, and each photodiode converts light received by the photodiodes into electrical charge, and each photodiode junction is disposed at a different respective depth within the substrate; and
a plurality of active pixel sensor control circuits for converting the electrical charge into voltage;
wherein the CMOS image sensor is devoid of a selective near infrared (SNIR) filter or an IR pass filter between the plurality of micro lenses and the photodiode junctions.

2. The CMOS image sensor of claim 1, wherein the CMOS image sensor is a front side illuminated (FSI) sensor.

3. The CMOS image sensor of claim 1, wherein the CMOS image sensor is a back side illuminated (BSI) sensor.

4. The CMOS image sensor of claim 3, further comprising a reflector for enhancing the received infrared light.

5. The CMOS image sensor of claim 1, wherein the first photodiode is disposed in the substrate at a depth of 0.2~0.5 micrometers, the second photodiode is disposed in the substrate at a depth of 0.5~1.5 micrometers, the third photodiode is disposed in the substrate at a depth of 1.5~3 micrometers and the fourth photodiode is disposed in the substrate at a depth of 3 micrometers and below.

* * * * *